United States Patent
van Bentum et al.

(10) Patent No.: US 7,064,074 B2
(45) Date of Patent: Jun. 20, 2006

(54) TECHNIQUE FOR FORMING CONTACTS FOR BURIED DOPED REGIONS IN A SEMICONDUCTOR DEVICE

(75) Inventors: Ralf van Bentum, Radebeul (DE); Manfred Horstmann, Dürrersdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 216 days.

(21) Appl. No.: 10/624,712

(22) Filed: Jul. 22, 2003

(65) Prior Publication Data

US 2004/0152324 A1   Aug. 5, 2004

(30) Foreign Application Priority Data

Jan. 31, 2003   (DE) ............................... 103 03 926

(51) Int. Cl.
*H01L 21/302* (2006.01)

(52) U.S. Cl. .................... 438/706; 370/447; 370/710

(58) Field of Classification Search ............ 438/700, 438/706, 710, 702, 626, 645, 643, 647, 648, 438/6, 370, 444, 447
See application file for complete search history.

(56) References Cited

U.S. PATENT DOCUMENTS

| | | | |
|---|---|---|---|
| 4,256,514 A | 3/1981 | Pogge | 148/1.5 |
| 5,629,238 A * | 5/1997 | Choi et al. | 438/645 |
| 5,872,045 A * | 2/1999 | Lou et al. | 438/432 |
| 6,091,154 A | 7/2000 | Ohkawa | 257/774 |
| 6,096,612 A | 8/2000 | Houston | 438/296 |
| 6,479,377 B1 * | 11/2002 | Tang et al. | 438/618 |
| 6,498,372 B1 * | 12/2002 | Brown et al. | 257/355 |

* cited by examiner

*Primary Examiner*—Lan Vinh
(74) *Attorney, Agent, or Firm*—Williams, Morgan & Amerson, P.C.

(57) ABSTRACT

A semiconductor device comprises an isolation trench and a contact trench that may contact a buried conductive region. The contact trench comprises insulating sidewall spacers that are formed during the filling of the isolation trench with an insulating material and the subsequent anisotropic etching of the excess material. Thereafter, the contact trench is filled with a conductive material. Thus, the formation of a contact for a buried region may be carried out simultaneously with the formation of a trench isolation structure, thereby minimizing the number of process steps required.

22 Claims, 2 Drawing Sheets

TECHNIQUE FOR FORMING CONTACTS FOR BURIED DOPED REGIONS IN A SEMICONDUCTOR DEVICE

BACKGROUND OF THE INVENTION

1. Field of the Invention

The present invention generally relates to the fabrication of integrated circuits, and, more particularly, to the formation of a contact connecting to a buried conductive region formed in a semiconductor substrate.

2. Description of the Related Art

In modern integrated circuits, a huge number of individual circuit elements, such as transistors, resistors, capacitors and the like, are typically formed on a limited chip area, wherein the feature sizes of the individual circuit elements are typically shrunk for every new device generation so as to enhance the functionality of the circuit by improving the performance of the individual circuit elements and by increasing the number of circuit elements provided on a specified chip area. Increasing the number of circuit elements per unit area typically entails an even stronger increase of the number of electrical connections connecting the individual circuit elements in accordance with the design requirements.

In addition to doped semiconductor lines provided as extra layers and metal lines provided in the form of so-called metallization layers, typically so-called buried lines, i.e., buried zones or regions formed in the semiconductor substrate below the surface thereof, may be used as connections between circuit elements and/or circuit regions without requiring the formation of any extra layers above the substrate layer bearing the circuit elements. These buried lines, however, need to be contacted so as to supply any voltage or signals thereto, wherein a photolithography technique is conventionally used that requires the alignment of a corresponding image mask to the buried lines formed in the semiconductor substrate. After exposure and development of the photoresist used during the photolithography step, the corresponding resist mask is then used to form an opening to the buried line by, for instance, anisotropic etch techniques. Subsequently, the opening is filled with an appropriate material, such as a refractory metal, thereby forming a low-ohmic contact to the buried line. The involved photolithography step requiring a precise alignment in order to obtain an optimum conductivity between the contact material and the buried line is, however, time-consuming and thus cost-intensive.

Accordingly, a need exists for a technique that enables the formation of a contact connecting to a buried line with a minimum number of additional process steps and a high degree of compatibility to existing process schemes.

SUMMARY OF THE INVENTION

The present invention is based on the concept that a contact may be formed substantially at the same time and using at least partially the same process steps as are typically employed for forming shallow trench isolation structures as are frequently incorporated in advanced integrated circuits. By integrating the formation process for the contact to a buried region into the process scheme designed for the formation of the shallow trench isolation structures, the number of additional steps required is significantly reduced compared to the conventional approach. Moreover, the formation of the contact may be designed as a self-aligned process, eliminating the necessity for an additional alignment step.

According to one illustrative embodiment of the present invention, the method comprises the formation of an isolation trench and a contact trench in a substrate having formed therein a buried region, wherein a width of the isolation trench is less than a width of the contact trench. The contact trench is formed so as to connect to the buried region. Moreover, a dielectric material is deposited over the substrate to substantially fill the isolation trench. Furthermore, the dielectric material is at least partially removed from a bottom of the contact trench and a conductive material is filled in the contact trench to form a contact to the buried region.

In accordance with still a further illustrative embodiment of the present invention, a method comprises the formation of an isolation trench and a contact trench in a substrate, wherein a width of the isolation trench is less than a width of the contact trench. A dielectric material is deposited over the substrate to substantially fill the isolation trench and a buried region is formed below the contact trench. The dielectric layer is at least partially removed from a bottom of the contact trench and a conductive material is filled in the contact trench to form a contact to the buried region.

BRIEF DESCRIPTION OF THE DRAWINGS

The invention may be understood by reference to the following description taken in conjunction with the accompanying drawings, in which like reference numerals identify like elements, and in which.

Figure 1A:
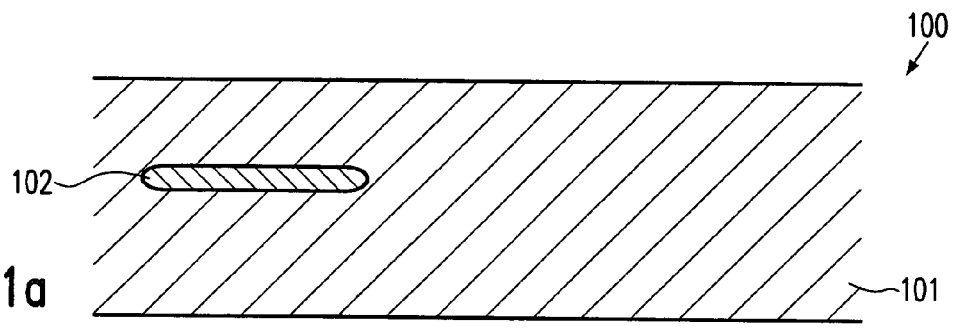
FIGS. 1a–1f schematically show cross-sectional views of a semiconductor structure during various steps in forming a contact to a buried region simultaneously with forming a trench isolation structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As is well known, in advanced integrated circuits, so-called trench isolation structures are frequently used to electrically insulate neighboring circuit elements from each other. The formation of these trench isolation structures requires photolithography, deposition and anisotropic etch techniques in a more or less advanced form, depending on the design requirements, i.e., the dimensional limitations of the isolation trenches to be formed. This process sequence may advantageously be used to simultaneously form isolation trenches and contact trenches, thereby merely requiring an altered photolithography mask, taking account of the additional contact trenches, the dimensions of which are designed to provide for the desired high conductivity. The lateral dimension of the contact trench, i.e., the trench width, significantly exceeds the corresponding dimension of the isolation trench so that no further issues are involved in the photolithographic formation of the contact trench once an appropriate photolithography technique is selected for the formation of the isolation trench exhibiting a more critical size. Thus, the complexity of the photolithography step, which may be considered as a critical step for extremely reduced feature sizes of advanced isolation structures, does not gain in complexity owing to the additional formation of the contact trenches.

The process of filling the isolation trenches with an insulating material may be performed similarly as in a conventional process, wherein the conformal deposition of the insulating material only reduces the effective width of the contact trenches without filling them due to the different widths of the isolation trenches and the contact trenches. Subsequently, these contact trenches with a reduced width may be filled with a conductive material so as to provide electrical contact to a buried conductive region that may be formed prior, during and after the trench formation.

With reference to FIGS. 1a–1f, further illustrative embodiments of the present invention will now be described in more detail. In FIG. 1a, a semiconductor structure 100 comprises a substrate 101, for example, a silicon substrate, a silicon-on-insulator (SOI) substrate having formed thereon a semiconductive layer, or any other appropriate substrate having formed thereon a semiconductive material appropriate to form circuit elements for an integrated circuit. It should be noted that, in the following, a silicon substrate will be referred to since the majority of integrated circuits available on the market are silicon-based devices. The present invention is, however, applicable to any semiconductor device requiring the formation of trench isolation structures for insulating circuit elements.

In the substrate 101, a buried conductive region 102 is formed having a shape and dimensions as required for providing the desired conductivity. For instance, the buried region 102 may comprise a dopant concentration, such as dopants of an N-conductivity type, when the substrate 101 is of P-conductivity type, in a concentration sufficient to enhance the intrinsic conductivity in the desired manner. A depth at which the buried region 102 is located is selected so as to correspond to the design requirements for the formation of trench isolation structures, as will be described with reference to FIG. 1b.

A typical process flow for forming the semiconductor structure 100 as shown in FIG. 1a may comprise the following steps. After forming a resist mask (not shown), possibly preceded by the formation of any sacrificial liners, such as an oxide liner, an implantation sequence is performed with a specified type of dopant, a predefined acceleration energy, and an appropriate dose for a predefined duration so as to obtain a desired dopant concentration and profile at the desired depth and location within the substrate 101. It should be noted that the shape of the buried region 102 may be formed in accordance with design requirements, and may, for example, be designed as a line connecting to circuit elements and/or chip areas to be formed in and on the substrate 101. Appropriate implantation parameters may be established by experiment or well-known one-dimensional simulation techniques. Thereafter, the resist mask may be removed and an anneal cycle may be performed to activate the dopant atoms in the buried region 102. The buried region 102 may be formed prior to the formation of any other implant regions, such as well regions of transistor elements and, consequently, the anneal cycle may not contribute to the thermal budget of the circuit elements still to be formed. As previously noted, the buried region 102 may not necessarily be formed at this stage of the manufacturing process, but may be formed at a later stage, as will be described in more detail later on.

Figure 1B:
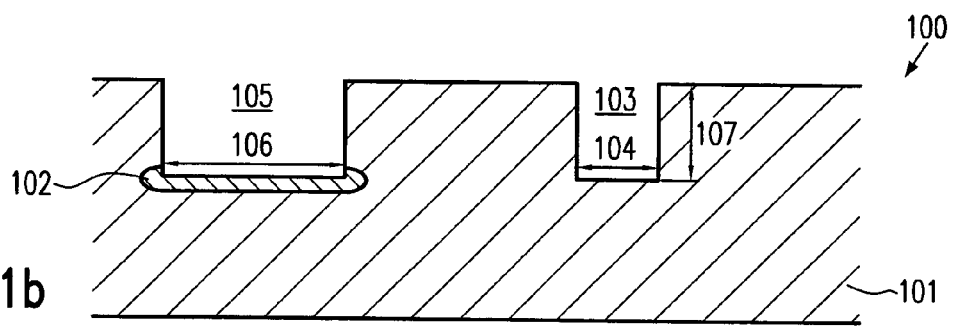

FIG. 1b schematically shows the semiconductor structure 100 with an isolation trench 103 having an extension 104 in the lateral direction, i.e., the horizontal direction in FIG. 1b, that is selected in accordance with design requirements. The lateral dimension 104, also referred to herein as trench width, may range from several micrometers to approximately 0.1 micrometers or even less for highly sophisticated integrated circuits. A depth 107 of the isolation trench 103 may be in the range of approximately 0.2–1 μm, wherein, in future device generations with further reduced feature sizes, the depth 107 may even be reduced to approximately 0.2 to 0.1 μm and even less. Above and partially in the buried region 102, a contact trench 105 is formed having a trench width 106 that is significantly larger than the trench width 104 of the isolation trench 103. In one embodiment, the trench width 106 may be selected to substantially conform to the lateral dimension of the buried region 102. In other embodiments, the trench width 106 may exceed the lateral dimension of the buried region 102, thereby significantly relaxing any overlay concerns when forming the buried region 102 prior to the contact trench 105. Moreover, the dimension of the buried region 102 as well as of the contact trench 105 typically do not represent critical parameters and may be selected sufficiently large to result in an overlap of the contact trench 105 and the buried region 102 of a desired size even if the alignment accuracy in the photolithography process for forming the trench isolation structure is subjected to the highest process fluctuations that are acceptable in forming the isolation trench 103.

In other cases, the lateral dimension of the buried region 102 may be significantly greater than the trench width 106, especially when a high conductivity of the buried region 102 is desirable and requires a sufficiently large cross-sectional area to provide for the required high conductivity at a reasonable dopant concentration. Depending on the type of conductive material to be filled in the contact trench 105, the trench width 106 may then be correspondingly sized so as to meet the requirements for a low-ohmic contact. For instance, for a highly conductive metal, the trench width 106 may be selected significantly smaller than, for example, a doped polysilicon, to be filled in the contact trench 105.

It should be noted that irrespective of the actually selected dimensions of the contact trench 105, the width 106 is selected to exceed the width 104 of the isolation trench 103 to maintain a minimum effective trench width at a subsequent process for the filling of the isolation trench 103.

A typical process flow for forming the trenches 103 and 105 may involve well-known isolation trench structure process sequences, such as forming a resist mask and anisotropically etching the trenches 103 and 105 until the required depth 107 is reached. Since an etch rate for the material of the substrate 101 may be well known, the depth 107 may be controlled by adjusting an etch time so as to obtain the required depth 107. The extension of the buried region 102 may be selected in such a way that it is well above the tolerances of the well-established etch techniques so that the etch process stops may reliably stop within the buried region 102.

In other embodiments, the heavily doped buried region 102 may release dopant atoms into the etch atmosphere when the etch process reaches the buried region 102 SO that a corresponding signal may be established by a spectroscopic analysis of the etch atmosphere. The occurrence of such a representative signal may then be used to determine an endpoint of the anisotropic etch process.

Subsequently, any processes may be carried out in conformity with conventional isolation structure formation processes, such as corner rounding of the trenches by, for example, growing a thermal oxide within the trenches. For the sake of convenience, these processes are not shown in FIG. 1b.

Figure 1C:
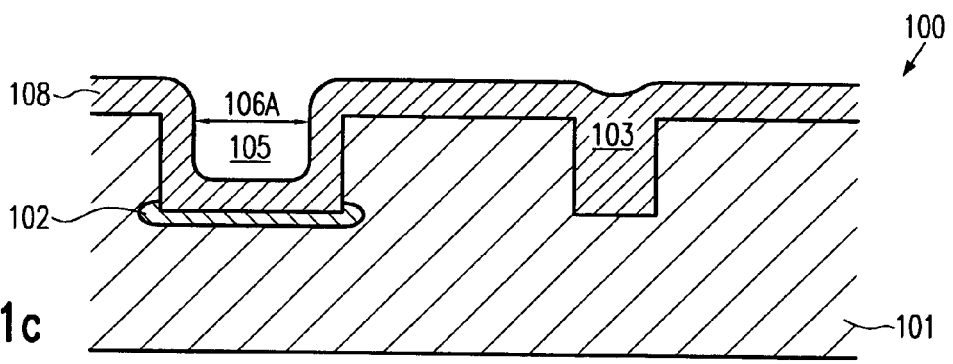

FIG. 1c schematically shows the semiconductor structure 100 with an insulating material layer 108 formed over and in the trenches 103 and 105, wherein the isolation trench 103 is substantially completely filled with the insulating material. The insulating layer 108 may be comprised of a layer stack including, for instance, a thin silicon nitride layer followed by a bulk silicon dioxide layer. Other material stacks including at least one dielectric material so as to insure insulating characteristics of the insulating layer 108 within the isolation trench 103 may also be used. The insulating layer 108 may be formed by well-established deposition techniques, such as plasma-enhanced chemical vapor deposition (CVD), which allow a substantial conformal deposition of the material and also exhibit a sufficient fill capability so as to generate a required degree of fullness in the isolation trench 103. It should be noted that the isolation trench 103 may not necessarily be completely filled with the material of the layer 108, but a small void or seam may remain within the trench 103. At any rate, due to the significantly larger lateral dimensions of the contact trench 105 compared to the isolation trench 103, the highly conformal deposition reduces the lateral dimension of the trench 105 in correlation with a thickness of the layer 108, but leaves the trench with an inner space, indicated by a width 106a.

The deposition parameters for reliably filling—in the above explained sense—the isolation trench 103 may readily be established in advance so that the lateral dimension, i.e., the initial width 106 (FIG. 1b), may be selected on the basis of these deposition parameters to obtain a required effective width 106a, which substantially determines the cross-sectional area and, thus, in combination with the type of conductive material used, the electrical conductivity of the contact to be formed in the trench 105.

In one embodiment, the structure 100 may essentially be formed as described with reference to FIGS. 1b and 1c, wherein, however, the buried region 102 has not yet been formed. In order to generate the required dopant concentration below the contact trench 105 to form the buried region 102, an implantation step may be performed with an energy and dose that allows the incorporation of dopant atoms into the substrate 101 through the layer 108. This may be advantageous when a doped region is to be formed in a self-aligned manner, having substantially a shape and dimensions corresponding to the contact trench 105. Moreover, in other embodiments, the implantation may be performed in such a way that the penetrating ions are substantially concentrated at the bottom of the trench 105, i.e., substantially still within the insulating layer 108, wherein, in a subsequent anneal cycle, the dopants are diffused into the substrate 101. In this way, crystal damage to the substrate in forming the buried region 102 is minimized. It should be noted that typically, due to the deposition kinetics, a thickness of the layer 108 at the bottom of the contact trench 105 may be slightly smaller than a thickness of the layer 108 on horizontal surface portions of the substrate 101 so that implantation-induced damage of the horizontal surface portions of the substrate 101 may be kept within an acceptable range, as the peak concentration of the dopants may be located above the horizontal surface portion, whereas the peak concentration in the contact trench 105 may already be located within the substrate 101.

In a further embodiment, during the deposition of the layer 108, a dopant material may be added, preferably at a final phase of the deposition process, to the deposition atmosphere in the form of an appropriate precursor during a CVD process so as to obtain a highly doped surface portion of the layer 108, wherein a portion of these dopants may be driven into the substrate 101 below the contact trench 105. The dopant diffusion may not substantially adversely affect the insulation characteristics of the isolation trench 103, since the dopants may be added to the deposition atmosphere at a time when the trench 103 is already substantially filled with insulating material. In a further embodiment, the deposition of a doped dielectric material at a final stage of the deposition process and a subsequent low energy implantation process may be performed, wherein preferably the implantation is designed to avoid penetration of horizontal surface portions of the substrate 101 by dopant ions that may otherwise affect subsequent processes steps in manufacturing circuit elements such as transistors.

Irrespective of whether the buried region 102 is formed prior to or after formation of the trenches 103 and 105, the material layer 108 is then partially removed by an anisotropic etch procedure, wherein—depending on the type of material present in the layer 108—a first anisotropic step may remove the bulk material of the layer 108, and wherein an underlying sublayer such as the silicon nitride layer described earlier may act as an etch stop layer. In a further embodiment, the anisotropic etch process is performed with reactive precursors having a predefined etch selectivity between the insulating material of layer 108 and the substrate 101. For example, if the layer 108 is comprised of silicon dioxide and the substrate is comprised of silicon, at least in those areas where the trenches 103, 105 are formed, respective well-known selective etch schemes may be employed. However, other schemes may be employed depending on the process requirements and the materials used.

Figure 1D:
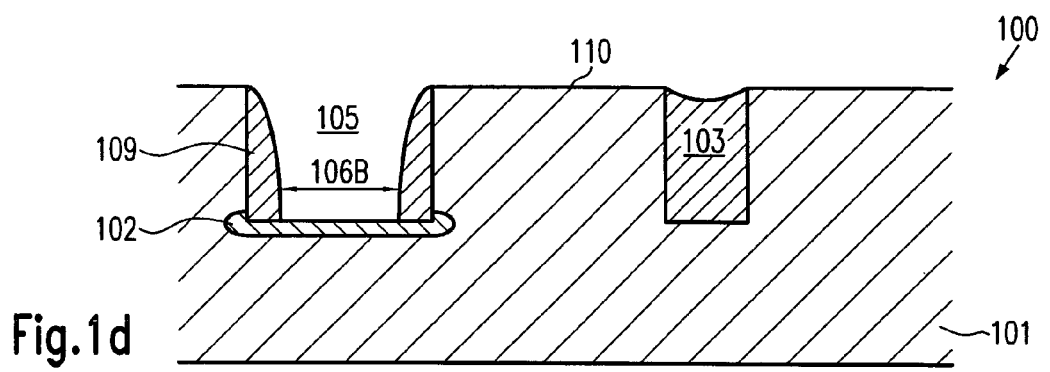

FIG. 1d schematically shows the semiconductor structure 100 after completion of the anisotropic etch process for partially removing the insulating layer 108. Due to the preceding anisotropic etch process, sidewall spacers 109 are formed on sidewalls of the trench 105, wherein the effective width of the trench 105 in the vicinity of the bottom thereof may be somewhat increased compared to the width 106a due to the material removal during the anisotropic etch process. The actual trench width may vary along the depth direction of the trench 105 and may be specified by the width at the bottom, indicated by 106b in FIG. 1d. On surface portions 110 of the substrate 101, the insulating layer 108 is substantially completely removed, wherein an etch stop layer, such as the silicon nitride layer, may have been removed by a wet chemical etch process so that especially the bottom of the contact trench 105 is substantially devoid of any insulating material. In one embodiment, a shallow implant process may then be performed to provide for a higher conductivity at the interface between the contact trench 105 and the underlying buried region 102. The shallow implant process may be designed so as to result in a penetration depth that is substantially confined to the extension of the buried region 102 in the depth direction. In this way, the penetration of dopant ions through the surface portions 110 is also restricted to a similar range and may not adversely affect further process steps in forming circuit elements, or may readily be compensated for by subsequent implant cycles performed during the fabrication of the circuit elements. In some cases, it may be considered appropriate to form a resist mask substantially covering the surface portions 110, while exposing the contact trench 105. Since the dimensions of the contact trench 105 are moderately large compared to critical circuit features, overlay or alignment concerns in a corresponding non-critical photolithography may not add undue complexity to the overall process.

In one embodiment, a plasma treatment may be carried out, wherein the plasma ambient contains a dopant material, which may then—by application of a relatively low bias voltage between the plasma ambient and the substrate 101—be incorporated in surface portions thereof so as to obtain a decreased contact resistance at the bottom of the contact trench 105.

In a further embodiment, the buried region 102 may be formed at this stage of the process by, for example, appropriately designing an implantation process to provide for the required dopant concentration below the trench 105. In this way, the buried region 102 is obtained in a self-aligned fashion. As pointed out above, if the dopants implanted into the surface portions 110 may be considered as negatively affecting the device fabrication of other circuit elements, a resist mask may be formed prior to the implantation, wherein the photolithography is non-critical as pointed out above.

Figure 1E:
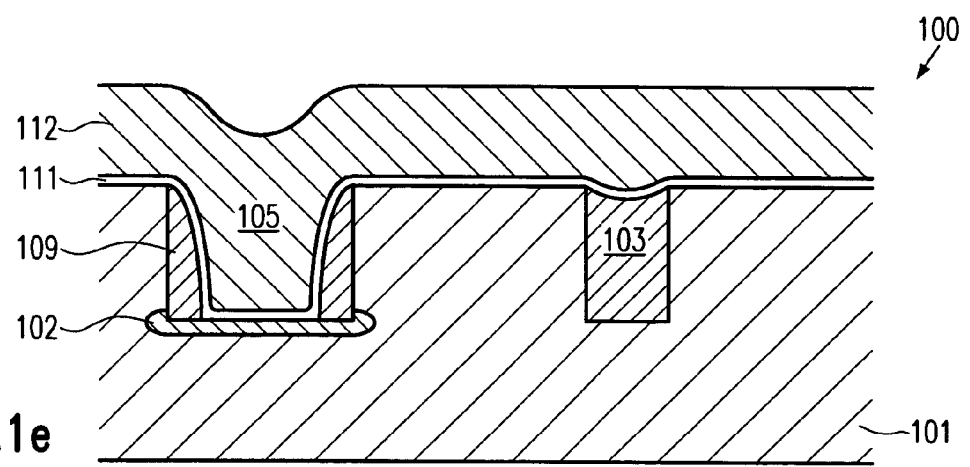

FIG. 1e schematically shows the semiconductor structure 100 with a layer of conductive material 112 formed over the substrate 101 and especially within the contact trench 105. The layer 112 may be comprised of any appropriate conductive material and may be advantageously comprised of a material that is thermally stable at high temperatures possibly created during the subsequent process steps required for forming the circuit elements. For example, refractory metals such as tungsten, cobalt, titanium, tantalum, and the like may be used. In other embodiments, the layer 112 may be substantially comprised of doped polysilicon. As previously noted, the dimensions of the buried region 102 and the contact trench 105 may be selected in advance on the basis of the electrical characteristics of the material(s) comprising the layer 112. Consequently, in embodiments requiring moderately small dimensions for the contact trench 105, highly conductive refractory metals such as tungsten may be preferred, whereas highly doped polysilicon exhibiting excellent thermal stability may be employed when increased dimensions of the contact trench 105 are less of a concern.

In one embodiment, the layer 112 may comprise at least one sublayer 111 comprised of a material that acts as a diffusion barrier and/or an adhesion layer for the bulk material of the layer 112. For instance, the barrier layer 111 may be comprised of titanium and/or titanium nitride, which sufficiently prevents out-diffusion of metal atoms, such as tungsten atoms, into underlying material regions. Any other well-established deposition schemes as, for example, employed in contact formation of circuit elements, such as transistors, may also be used so as to achieve a required performance of the contact to be formed and/or a desired compatibility to further process steps.

The layer 112 may be deposited by well-established deposition techniques, such as CVD and/or physical vapor deposition (PVD), which may be preferred for depositing a metal. In case a doped polysilicon is used for the layer 112, a plasma-enhanced CVD process may be employed, wherein dopants may be added during the deposition process, or may be incorporated into the layer 112 as deposited by a following implantation step. It should be noted that the layer 112 may preferably be deposited with a sufficient amount of "over-fill" to reliably completely fill the contact trench 105.

Figure 1F:
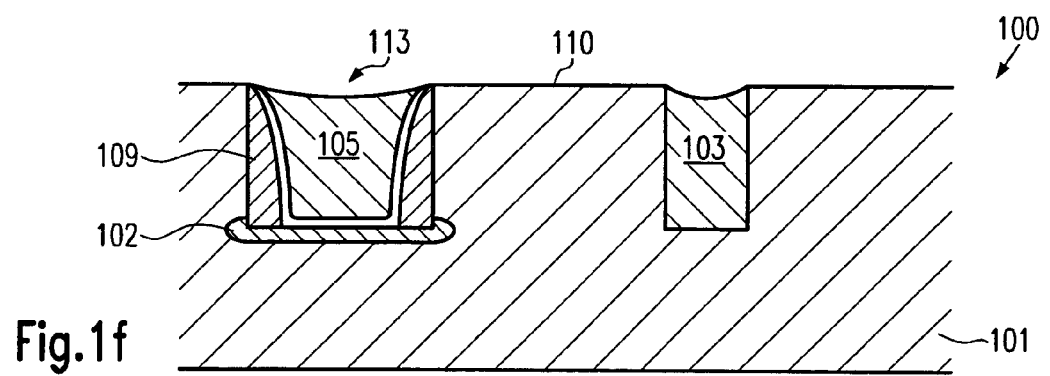

FIG. 1f schematically shows the semiconductor structure 100 with the majority of the layer 112 removed, thereby forming a contact 113 filled with conductive material. The excess material of the layer 112 may be removed by chemical mechanical polishing (CMP), wherein, in one embodiment, a certain degree of "over-polish" is performed to reliably remove the layer 112 at the surface portions 110.

In other embodiments, it may be considered appropriate to stop the CMP process at the surface portions 110 or immediately before reaching the surface and remove material residuals arising from process non-uniformities of the CMP process by a subsequent clean process involving a wet chemical and/or a plasma treatment, wherein a certain degree of selectivity of the clean process with respect to the layer 112 and the substrate 101 may assist in substantially preserving the integrity of the surface portions 110. In a further embodiment, the barrier layer 111 may be designed to act, additionally or alternatively, as a CMP stop layer in order to significantly slow down the CMP process, once the layer 112 is removed at certain surface portions 110. The residuals may then be removed by etching or by a specifically designed CMP process.

In other embodiments, removing a thin surface layer of the substrate 101 during the CMP process and/or the clean process may be intentionally performed, thereby at least partially removing doped areas of the surface portion 110 that may be created by forming the buried region 102 after the formation of the contact trench, as is described with reference to FIG. 1b.

Thus, a planar surface of the substrate 101 is obtained including the electrically insulating isolation trenches 103 and the contacts 113 comprising a thermally stable material so that the further processing of the substrate may be resumed in accordance with standard process recipes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an isolation trench and a contact trench in a substrate, wherein a width of said isolation trench is less than a width of said contact trench;
   depositing an insulating material over said isolation trench and said contact trench to substantially fill said isolation trench and reduce an effective width of said contact trench;
   removing at least partially said insulating material from a bottom of said contact trench;
   filling in a conductive material into said contact trench to form a contact; and
   forming a buried conductive region in said substrate below said contact trench such that said buried region at least partially overlaps with said contact trench, said buried conductive region being conductively coupled to said contact, wherein said buried conductive region is formed prior to the formation of said isolation trench and said contact trench.

2. The method of claim 1, wherein said contact trench is positioned so that said effective width at least partially overlaps with said buried conductive region.

3. The method of claim 1, wherein said contact trench is positioned so that said contact trench extends into said buried conductive region.

4. The method of claim 1, wherein at least one of said width of said contact trench and at least one deposition parameter during the deposition of the dielectric material is adjusted to obtain said effective width substantially in accordance with a predefined design value thereof.

5. The method of claim 1, wherein said conductive material comprises a refractory metal.

6. The method of claim 1, wherein said conductive material comprises doped polysilicon.

7. The method of claim 1, further comprising implanting a dopant species into said buried region prior to at least partially removing said dielectric material from the bottom of said contact trench.

8. The method of claim 1, further comprising implanting a dopant species into said buried region after at least partially removing said dielectric material from the bottom of said contact trench.

9. The method of claim 1, wherein removing at least partially said insulating material includes anisotropically etching said insulating material.

10. The method of claim 9, wherein depositing said insulating material includes depositing an etch stop layer and depositing on said etch stop layer a dielectric layer.

11. The method of claim 1, wherein filling a conductive material in said contact trench includes depositing said conductive material over said contact trench and isolation trench and removing excess material of said conductive material by chemical mechanical polishing.

12. The method of claim 11, wherein depositing said conductive material includes depositing a barrier layer on inner sidewalls of said contact trench.

13. A method, comprising:
    forming an isolation trench and a contact trench in a substrate, wherein a width of said isolation trench is less than a width of said contact trench;
    depositing an insulating material over said isolation trench and said contact trench to substantially fill said isolation trench and reduce an effective width of said contact trench;
    removing at least partially said insulating material from a bottom of said contact trench;
    filling in a conductive material into said contact trench to form a contact;
    forming a buried conductive region in said substrate below said contact trench such that said buried region at least partially overlaps with said contact trench, said buried conductive region being conductively coupled to said contact, wherein said buried conductive region is formed prior to the formation of said isolation trench and said contact trench, and wherein said contact trench is positioned so that said effective width at least partially overlaps with said buried conductive region and said contact trench extends into said buried conductive region.

14. The method of claim 13, wherein at least one of said width of said contact trench and at least one deposition parameter during the deposition of the dielectric material is adjusted to obtain said effective width substantially in accordance with a predefined design value thereof.

15. The method of claim 13, further comprising implanting a dopant species into said buried region prior to at least partially removing said dielectric material from the bottom of said contact trench.

16. The method of claim 13, further comprising implanting a dopant species into said buried region after at least partially removing said dielectric material from the bottom of said contact trench.

17. A method, comprising:
    forming an isolation trench and a contact trench in a substrate, wherein a width of said isolation trench is less than a width of said contact trench;
    depositing an insulating material over said isolation trench and said contact trench to substantially fill said isolation trench and reduce an effective width of said contact trench;
    removing at least partially said insulating material from a bottom of said contact trench;
    filling in a conductive material into said contact trench to form a contact;
    forming a buried conductive region in said substrate below said contact trench such that said buried region at least partially overlaps with said contact trench, said buried conductive region being conductively coupled to said contact, wherein said buried conductive region is formed prior to the formation of said isolation trench and said contact trench, and wherein said contact trench is positioned so that said effective width at least partially overlaps with said buried conductive region; and implanting a dopant species into said buried region prior to at least partially removing said dielectric material from the bottom of said contact trench.

18. The method of claim 17, wherein said contact trench is positioned so that said contact trench extends into said buried conductive region.

19. The method of claim 17, wherein at least one of said width of said contact trench and at least one deposition parameter during the deposition of the dielectric material is adjusted to obtain said effective width substantially in accordance with a predefined design value thereof.

20. A method, comprising:
forming an isolation trench and a contact trench in a substrate, wherein a width of said isolation trench is less than a width of said contact trench;
depositing an insulating material over said isolation trench and said contact trench to substantially fill said isolation trench and reduce an effective width of said contact trench;
removing at least partially said insulating material from a bottom of said contact trench;
filling in a conductive material into said contact trench to form a contact;
forming a buried conductive region in said substrate below said contact trench such that said buried region at least partially overlaps with said contact trench, said buried conductive region being conductively coupled to said contact, wherein said buried conductive region is formed prior to the formation of said isolation trench and said contact trench, and wherein said contact trench is positioned so that said effective width at least partially overlaps with said buried conductive region; and
implanting a dopant species into said buried region after at least partially removing said dielectric material from the bottom of said contact trench.

21. The method of claim 20, wherein said contact trench is positioned so that said contact trench extends into said buried conductive region.

22. The method of claim 20, wherein at least one of said width of said contact trench and at least one deposition parameter during the deposition of the dielectric material is adjusted to obtain said effective width substantially in accordance with a predefined design value thereof.

* * * * *